(12) United States Patent
Krause et al.

(10) Patent No.: US 6,812,689 B2
(45) Date of Patent: Nov. 2, 2004

(54) METHOD AND DEVICE FOR OFFSET-VOLTAGE FREE VOLTAGE MEASUREMENT AND ADJUSTMENT OF A REFERENCE VOLTAGE SOURCE OF AN INTEGRATED SEMICONDUCTOR CIRCUIT

(75) Inventors: Gunnar Krause, München (DE); Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 110 days.

(21) Appl. No.: 09/898,816

(22) Filed: Jul. 3, 2001

(65) Prior Publication Data

US 2002/0000828 A1 Jan. 3, 2002

(30) Foreign Application Priority Data

Jul. 3, 2000 (DE) .......................................... 100 32 257

(51) Int. Cl.[7] .............................................. G01R 31/00
(52) U.S. Cl. ...................................... 324/158.1; 324/765
(58) Field of Search ............................ 324/158.1, 73.1, 324/763, 765; 438/14, 17; 714/736, 733, 734; 365/200, 201

(56) References Cited

U.S. PATENT DOCUMENTS

| 5,212,442 A | * | 5/1993 | O'Toole et al. ............ 324/73.1 |
| 6,014,020 A | | 1/2000 | Kuttner |
| 6,163,867 A | * | 12/2000 | Miller et al. ................ 714/736 |
| 6,313,655 B1 | * | 11/2001 | Krause ........................ 324/763 |
| 6,504,394 B2 | | 1/2003 | Ohlhoff |

FOREIGN PATENT DOCUMENTS

DE         199 60 244 C1    2/2001

OTHER PUBLICATIONS

U. Tietze et al: "Halbleiter–Schaltungstechnik" (Semiconductor Circuit Engineering), Springer–Verlag, 1969, pp. 212–213, and 60–63.

* cited by examiner

Primary Examiner—Vinh P. Nguyen
(74) Attorney, Agent, or Firm—Laurence A. Greenberg; Werner H. Stemer; Gregory L. Mayback

(57) ABSTRACT

A method and device for measuring voltage of an internal reference voltage source of an integrated semiconductor circuit, in particular, a DRAM, including the steps of comparing a reference voltage to an external comparison voltage with a comparator, forming a measured value for the reference voltage to be set in accordance with a comparison result, switching a commutator by a clock- or software-control to alternatively apply the reference voltage and the comparison voltage to the comparator inputs at the same time, varying one of the reference and comparison voltage to a setpoint voltage value until the comparator output changes its logic value at each commutator switched stage, buffering the voltage values present for each switched state when the logic value changes, forming an average value for the reference voltage from the stored voltage values, and setting the reference voltage as a function of the average value formed.

24 Claims, 4 Drawing Sheets

METHOD AND DEVICE FOR OFFSET-VOLTAGE FREE VOLTAGE MEASUREMENT AND ADJUSTMENT OF A REFERENCE VOLTAGE SOURCE OF AN INTEGRATED SEMICONDUCTOR CIRCUIT

BACKGROUND OF THE INVENTION

Field of the Invention

The invention relates to a method and a device for measuring/adjusting a voltage of an internal reference voltage source of an integrated semiconductor circuit, in particular, of a dynamic semiconductor memory. The reference voltage to be measured is compared by a comparator with a comparison voltage supplied from the outside, and the measurement result is formed in accordance with the result of the comparison.

German Patent DE 199 60 244.1 describes a configuration for trimming reference voltages in semiconductor chips.

In particular, in the case of integrated memory modules, for example, dynamic semiconductor memories (DRAMs) it is necessary to adjust or trim the setpoint voltage of voltage generators located on the chip, which fluctuates due to fabrication tolerances. According to the current state of the art in circuit technology, it is not possible to make available such voltage on the chip with greater precision than ±10% without an adjusting or trimming procedure.

However, before such a trimming or adjusting procedure can be carried out, the chip-internal reference voltage must be measured.

In order to improve the measuring accuracy, the reference voltage is currently measured using an external test system. The voltage can be varied in a specific range using software registers. The suitable values in the registers are determined from the measured value in the test system to arrive at the correct internal voltage, and the suitable values can be burnt into the chip permanently by laser fuses.

Such a method contributes considerably to the test costs: during the measurement of the internal reference voltage of SDRAM modules, sixty-four (64) modules, for example, are measured in parallel per wafer. Thus, it is necessary to determine sixty-four (64) analogous voltages with a high degree of accuracy by the test system. In the case of embedded DRAMs, there are a plurality of reference voltages on one module, for example, eight (8) reference voltages. Experience has shown that considerable fluctuations in reference voltages also occur within the module. In such a case, eight (8) analogous reference voltages must be measured per module.

With the concept proposed in German Patent DE 199 60 244.1 specified above, it is possible to standardize an internal voltage by making an internal digital/analog converter run through various values of a correction voltage.

In addition, it is possible to measure an internal voltage by searching for an external voltage that corresponds to the internal reference voltage. For such a method, just one binary output has to be led out from the chip. To compare the external voltage supplied from the outside with the internal reference voltage, an operational amplifier serving as a comparator must have a very high degree of accuracy because the offset voltage is completely absorbed in the set value for the reference voltage.

However, in customary operational amplifiers (in particular, CMOS operational amplifiers), it is possible, without a large degree of expenditure on circuitry, for considerable offset voltages to occur that are known to be the consequence of parameter variation in the transistors of the amplifier. If it is desired to minimize such parameter variations, the operational amplifier becomes very complex and costly.

SUMMARY OF THE INVENTION

It is accordingly an object of the invention to provide a method and device for offset-voltage-free voltage measurement and adjustment of a reference voltage source of an integrated semiconductor circuit that overcomes the hereinafore-mentioned disadvantages of the heretofore-known methods and devices of this general type and that avoids the described problem of the offset voltage of the detecting operational amplifier so that a cost-effective operational amplifier can be used.

With the foregoing and other objects in view, there is provided, in accordance with the invention, a method for measuring and setting of a voltage of an adjustable internal reference voltage source of an integrated semiconductor circuit including the steps of comparing a reference voltage to an external comparison voltage with a comparator having two inputs, forming a measured value for the reference voltage that is to be set in accordance with a result of the comparison, switching a commutator by one of a clock-control and a software-control to alternatively apply the reference voltage and the external comparison voltage to the two inputs of the comparator at the same time, varying one of the reference voltage and the external comparison voltage in a direction of a setpoint voltage value until the comparator output changes its logic value at each switched stage of the commutator, buffering the voltage values present for each switched state of the commutator when the logic value of the comparator output changes and respectively varied in the preceding step, forming an average value for the reference voltage from the stored voltage values, and setting the reference voltage as a function of the average value formed in the preceding step. Preferably, the integrated semiconductor circuit is a dynamic semiconductor memory.

By the method according to the invention it is possible for the voltage value to be measured independently of the offset voltage of the operational amplifier serving as the comparator, by virtue of the fact that a change-over switch or commutator is provided upstream of the operational amplifier that functions as a comparator and the commutator alternately applies the reference voltage to be measured and the comparison voltage supplied from the outside to the comparator inputs. The measured value determined for the respective switched position of the commutator is stored in a piece of software that runs in a control unit forming, for example, part of a test equipment unit, and an average value is formed from the measured value. Thus, by software, the problem of the offset voltage of the comparator is avoided.

The method according to the invention proposes that the offset problems be avoided by a software solution. As such, the offset voltage is carried out by an offset elimination effectuated by software.

In accordance with another mode of the invention, it is also possible and, in view of the unavoidable RC characteristics of an external comparison voltage, possibly advantageous to vary the external comparison voltage incrementally and to place the commutator or change-over switch upstream of the comparator in both settings for each value of the comparison voltage.

In accordance with a further mode of the invention, it is also possible to fix the external comparison voltage at a setpoint value for the internal voltage, and to vary the internal reference voltage.

In accordance with an added mode of the invention, the varying step is carried out by maintaining the internal reference voltage constant while varying the external comparison voltage.

In accordance with an additional mode of the invention, the switching and varying steps are performed by, in a first switched state of the commutator, firstly varying the external comparison voltage in a voltage range around the setpoint voltage value with the reference voltage kept constant, and performing the buffering step by buffering that voltage value of the external comparison voltage at which the comparator output changes its logic state, and, in the second switched state of the commutator in which the reference voltage and the external comparison voltage are interchanged between the two comparator inputs in comparison with the first switched state of the commutator, varying the external comparison voltage in a voltage range around the setpoint voltage value with the reference voltage kept constant, and performing the buffering step by storing that voltage value of the external comparison voltage at which the comparator output changes its logic state.

In accordance with yet another mode of the invention, the external comparison voltage is incrementally varied.

In accordance with yet a further mode of the invention, the two switched states and of the commutator are assumed for each voltage value of the external comparison voltage.

In accordance with yet an added mode of the invention, the external comparison voltage is kept constant at a setpoint value for the internal reference value while the internal reference voltage is varied.

In accordance with yet an additional mode of the invention, the switching and varying steps are performed by, in a first switched state of the commutator, varying the reference voltage in a voltage range around the voltage value of the external comparison voltage that is kept constant with the external comparison voltage kept constant, and performing the buffering step by storing that voltage value of the reference voltage at which the comparator output changes its logic state, and, in the second switched state of the commutator, varying the reference voltage in a voltage range around the voltage value of the external reference voltage that is kept constant with the external comparison voltage kept constant, and performing the buffering step by storing that voltage value of the internal reference voltage at which the comparator output changes its logic state.

In accordance with again another feature of the invention, the internal reference voltage is incrementally varied.

With the objects of the invention in view, there is also provided a device for carrying out the method for measuring and setting of a voltage of an adjustable internal reference voltage source of an integrated semiconductor circuit including an internal reference voltage source providing an internal reference voltage, an external comparison voltage source providing an external comparison voltage, a comparator having two comparator inputs, a commutator having two commutator inputs and two commutator outputs, each of the two commutator inputs connected to a respective one of the internal reference voltage source and the external comparison voltage source, and each of the two commutator outputs directly connected to the two comparator inputs, the commutator alternately switching the two comparator inputs between the internal reference voltage and the external comparison voltage.

In accordance with again a further feature of the invention, there is provided a control unit connected to the commutator for switching the commutator In accordance with again an added feature of the invention, the program proposed for software-supported offset elimination resides preferably in a control unit that also switches the commutator into the two settings.

It is advantageous that only a small portion of the components necessary for the voltage measurement have to be located on the chip. As such, in accordance with again an additional feature of the invention, at least the commutator and the comparator are provided on the chip of the integrated memory module. As mentioned, the comparator can be implemented by a cost-effective operational amplifier that takes up little chip area.

In accordance with still another feature of the invention, the control unit can be implemented as a program-controlled processor unit programmed to store the voltage values present for each switched state of the commutator and to form an average value for the reference voltage from the stored voltage values.

Preferably, in accordance with still further features of the invention, the processor unit has a storage device or means for storing the voltage values, and/or an average value forming device or means for forming an average value for the reference voltage from the stored voltage values.

In accordance with still an added feature of the invention, the control unit is preferably part of an external test equipment unit or measuring equipment unit for testing the integrated semiconductor circuit.

With the objects of the invention in view, there is also provided a device for measuring and setting of a voltage of an adjustable internal reference voltage source of an integrated semiconductor circuit, in particular, a dynamic semiconductor memory, including an internal reference voltage source providing an internal reference voltage, an external comparison voltage source providing an external comparison voltage, a comparator having two comparator inputs and a comparator output for outputting a logic value, a commutator having switched stages, a switch input, two commutator inputs, and two commutator outputs, each of the two commutator inputs connected to a respective one of the internal reference voltage source and the external comparison voltage source, each of the two commutator outputs directly connected to a respective one of the two comparator inputs, the commutator alternately switching the two comparator inputs between the internal reference voltage and the external comparison voltage, the comparator comparing the internal reference voltage to the external comparison voltage, a switch control having a switch output connected to the switch input of the commutator for alternatively applying the internal reference voltage and the external comparison voltage to the two comparator inputs at the same time, and one of the internal reference voltage and the external comparison voltage are varied in a direction of a setpoint voltage value until the comparator output changes the logic value at each switched stage of the commutator.

In accordance with still an additional feature of the invention, a control unit is configured to form a measured value for the internal reference voltage that is to be set in accordance with a result of a comparison of the comparator, to buffer voltage values present for each of the switched states of the commutator when the logic value changes and the one of the internal reference voltage and the external comparison voltage is varied, to form an average value for the internal reference voltage from stored voltage values, and to set the internal reference voltage as a function of the average value formed.

In accordance with a concomitant feature of the invention, the switch control is a clock-control or a software-control With the features described above, the invention has in particular the following advantages:

The internal reference voltage can be measured independently of the offset voltage of the detecting operational amplifier and, subsequently, given a permanent setting. The error that occurs here in the voltage measurement can easily be kept within the submillivolt range.

The operational amplifier used is cheap and takes up only a small chip area.

The self-alignment logic can be tested because the data polarity has to be different depending on the position of the polarity switch.

As a result of the offset-tolerant method of voltage measurement, a high common mode range of the operational amplifier that serves as a comparator can be utilized.

Other features that are considered as characteristic for the invention are set forth in the appended claims.

Although the invention is illustrated and described herein as embodied in a method and device for offset-voltage-free voltage measurement and adjustment of a reference voltage source of an integrated semiconductor circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1A:
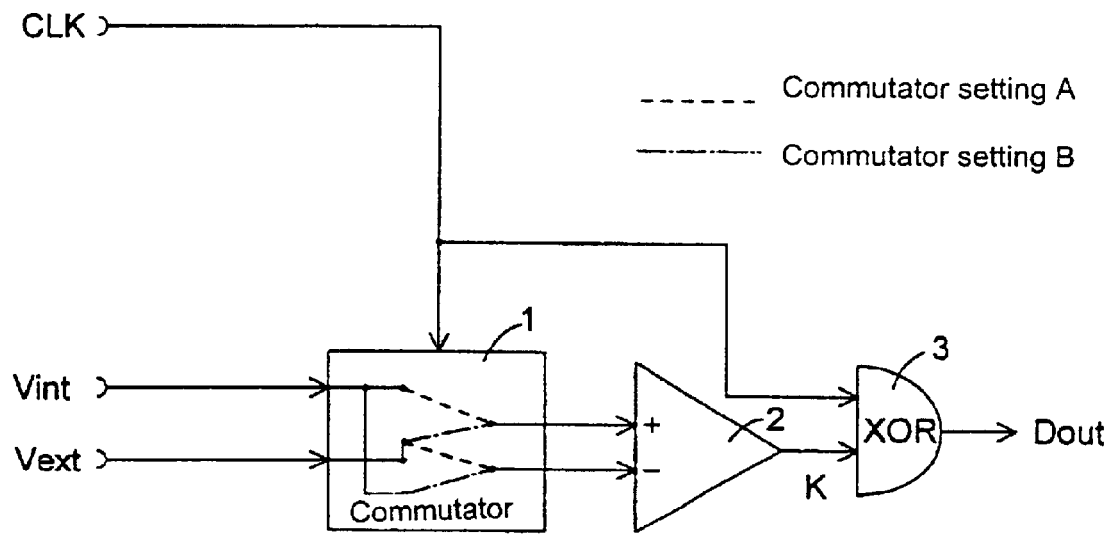
FIG. 1A is a block circuit diagram of a first exemplary embodiment of a measuring device according to the invention.

In all the figures of the drawing, sub-features and integral parts that correspond to one another bear the same reference symbol in each case.

Referring now to the figures of the drawings in detail and first, particularly to FIG. 1A thereof, there is shown, in the form of a block circuit diagram, a commutator 1 that is provided for switching the voltages to be applied to the two inputs (+, −) of a comparator 2, namely a chip-internal reference voltage (Vint) to be measured and a comparison voltage (Vext) that is supplied from the outside for such a purpose.

An embodiment is illustrated in which the commutator 1 is switched using a clock signal CLK so that the commutator 1 respectively assumes one switched setting and the other switched setting during the high and low level phases of the clock signal CLK. The output K of the comparator 2 is connected to an EX-OR element 3 to which the clock signal CLK is also supplied. The flowchart that is described below and illustrated in FIG. 2 and that relates to the execution of the measuring procedure according to the invention resides in a control unit 6 (FIG. 1B) that is preferably set up as a program-controlled processor unit and receives the output signal Dout of the EX-OR element 3 at the input end and outputs the external comparison voltage Vext and the measurement result Vaver for the internal reference voltage (Vint) to be measured, at the output end.

An exemplary measuring method will now be described with reference to the flowchart illustrated in FIG. 2. First, the commutator 1 is placed in setting A (steps S0 to S3) after the start of the program, initialization of the semiconductor module to be measured (for example DRAM), activation of the test mode, switching on of the comparator 2 and after the external comparison voltage Vext has been applied to the commutator 1. If the commutator 1 is placed in setting A in step S3, it is possible to proceed such that, first, the external comparison voltage Vext specifies the lowest expected voltage value for the reference voltage Vint to be measured. Alternatively (not illustrated in FIG. 2), the external comparison voltage Vext can specify the maximum voltage value of the reference voltage Vint to be measured.

An interrogation in step S4 interrogates, by the output signal Dout of the EX-OR element 3, whether or not the output K of the comparator 2 changes its logic value. Such a change is the case under the condition predefined in step S3 as soon as Vext has become greater than Vint. As long as the output K of the comparator 2 does not change its logic value, Vext is increased by a voltage increment DV. For the above-mentioned alternative procedure, if Vext specifies the maximum expected value of the reference voltage Vint to be measured, there would be an interrogation in interrogation step S4 to determine whether or not Vext has become smaller than Vint, and if such is not the case, Vext is reduced incrementally by the increment DV in step S5.

If the interrogation step S4 supplies a yes result, the present value of Vext is stored as the value Vext, A for the commutator setting A (step S6).

Then, in step S7 the commutator is placed in setting B, in which the two input voltages at the comparator inputs are interchanged (step S7), and the further steps S8–S10 then proceed analogously to the steps S4–S6. Here too, the alternative procedure described above can also be selected, namely that Vext specifies the maximum expected voltage of the internal reference voltage Vint in step S7. Finally, in step S11 the measured value for the reference voltage Vint to be measured is formed by forming arithmetic averages of the voltage values Vext, A and Vext, B respectively stored in steps S6 and S10. After the routine in FIG. 2 (step S12) has ended, Vint=Vaver can then be permanently set.

Figure 1B:
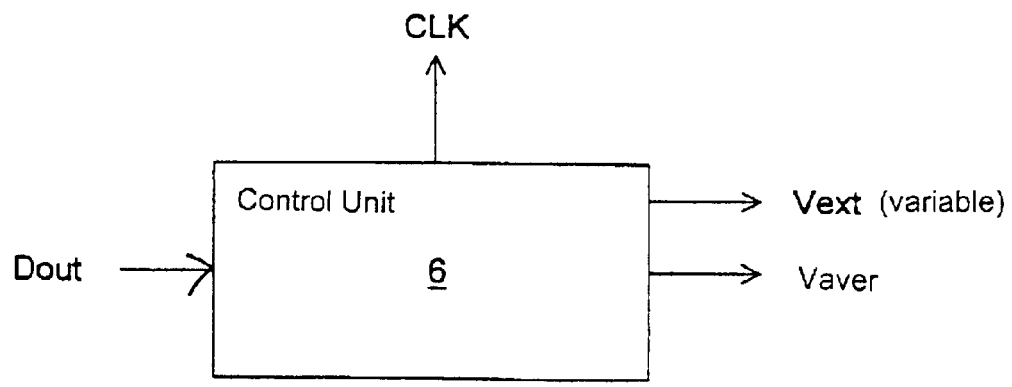
FIG. 1B is a block circuit diagram of a control unit for the embodiment of FIG. 1.
Figure 3A:
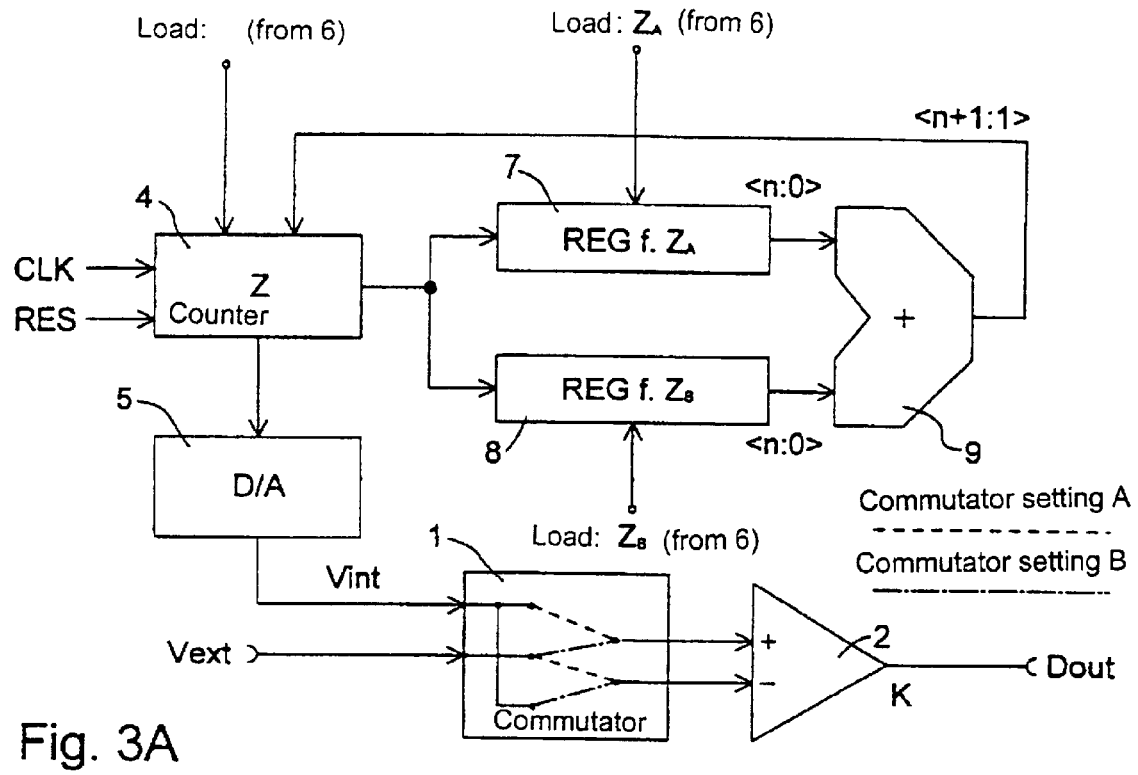
FIG. 3A is a block circuit diagram of a second exemplary embodiment of a measuring device according to the invention.
Figure 3B:
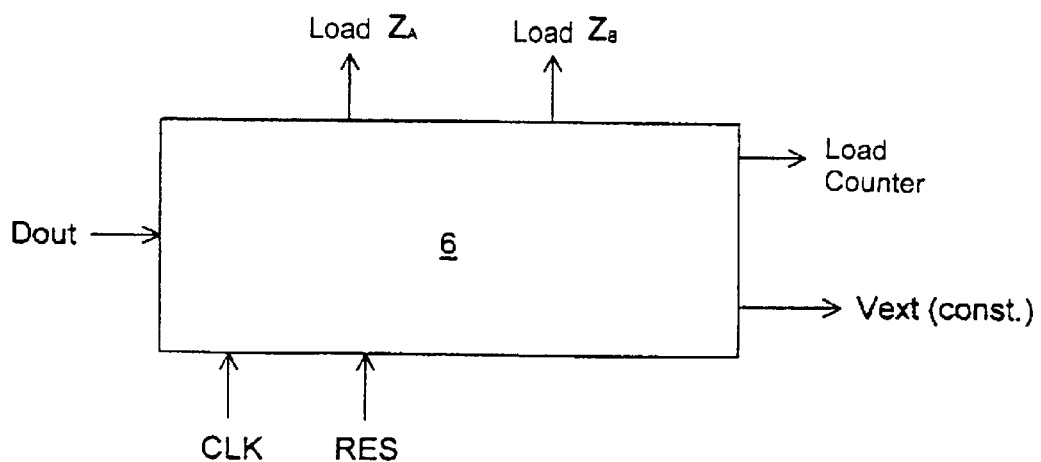
FIG. 3B is a block circuit diagram of a control unit for the second exemplary embodiment of FIG. 3A.

FIGS. 3A and 3B show, in the form of a block circuit diagram, an alternative measuring device according to the invention in which, in contrast with the device shown in FIGS. 1A and 1B, the external comparison voltage Vext is permanently predefined as the setpoint value for the reference voltage Vint to be measured, i.e., the internal reference voltage Vint that is to be set, and Vint is varied. The change in the internal reference voltage Vint takes place under clock control by a counter 4 and a digital/analog converter 5 whose output supplies the analogous reference voltage Vint and feeds it to one of the inputs of the commutator 1. The other input of the commutator 1 has the constant external comparison voltage Vext applied to it. The counter 4 is preset by the control unit 6 to a preset value that corresponds to an expected value for Vint. The counter readings ZA and ZB relating to the commutator settings A and B are then respectively determined and buffered in a register 7 and a register 8. An average value former 9 determines the offset-voltage-corrected counter reading (ZA+ZB)/2 from the counter readings ZA and ZB buffered in the registers 7 and 8. The halving is carried out by index displacement. As such, the correct value for the internal reference voltage Vint can be determined (measured) by adding simple hardware components 4, 5 and 7 to 9, which take up little space, to the comparator 1 and the commutator 2 on the semiconductor chip. The program that is to be provided in the control unit 6 is correspondingly simplified.

Figure 4:
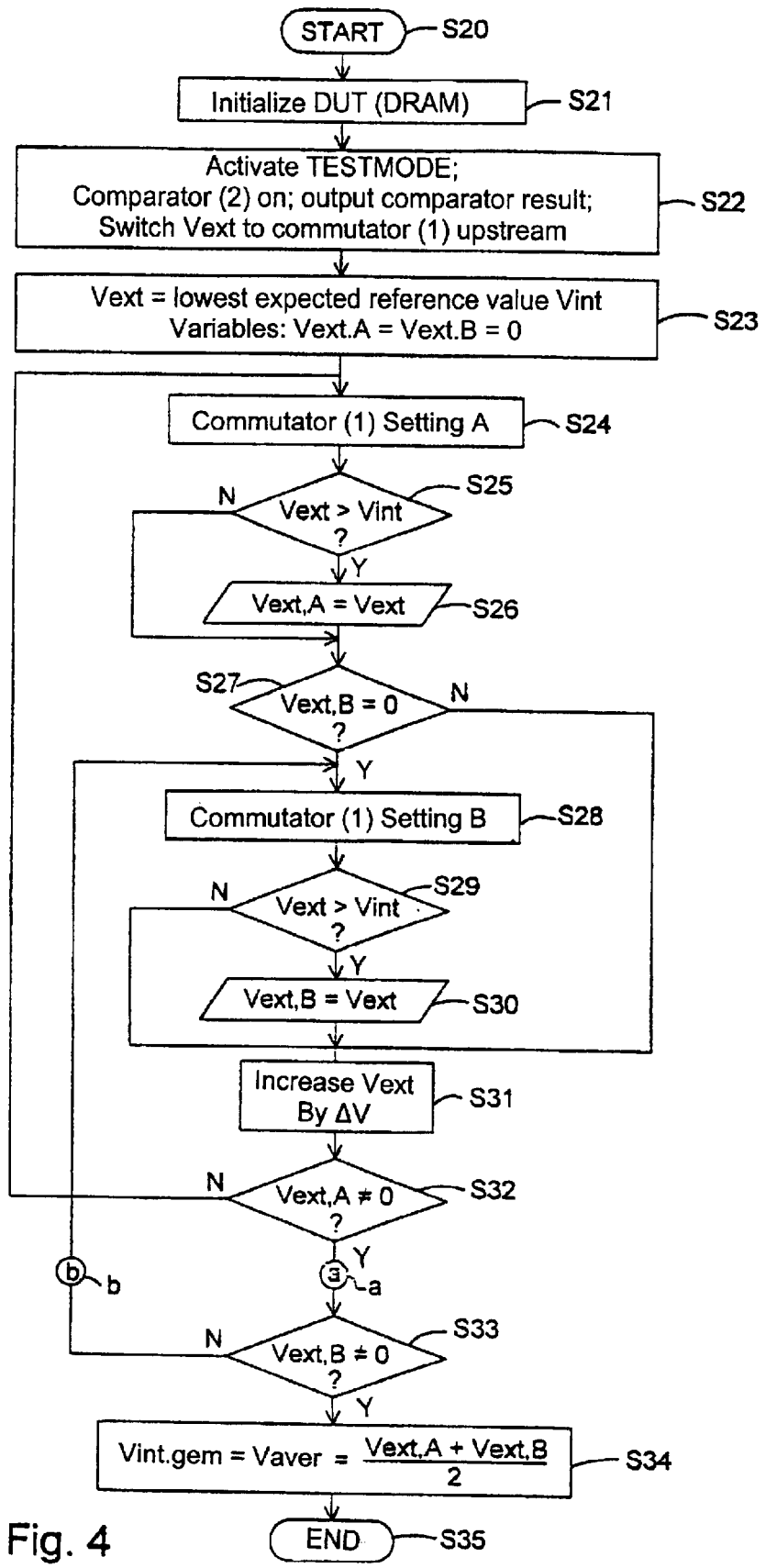
FIG. 4 is a flowchart of an alternative sequential program for carrying out the measuring method according to the invention.

FIG. 4 shows, in the form of a flowchart, an alternative procedure for measuring Vint if the external comparison voltage Vext is varied, that is to say based on the block circuit diagram shown in FIGS. 1A and 1B.

Figure 2:
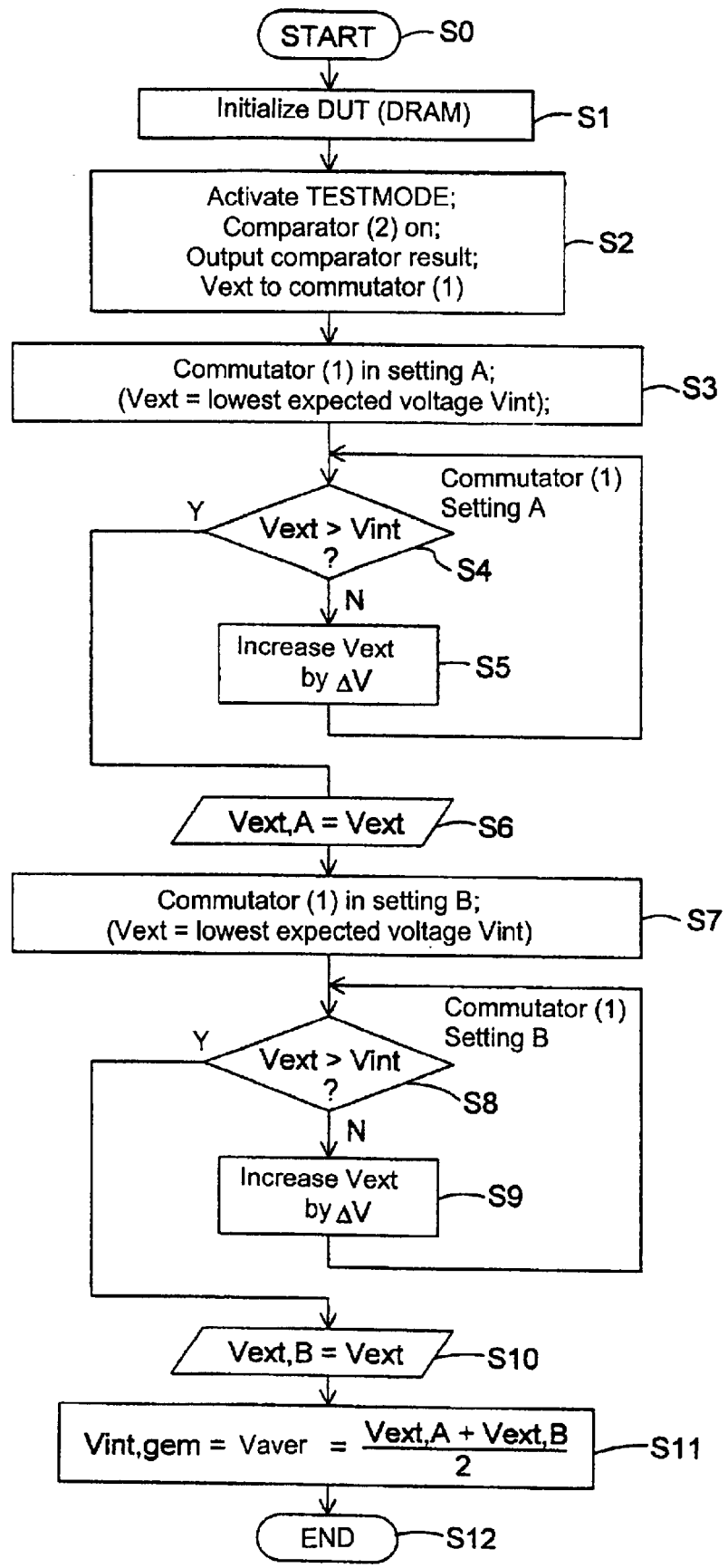
FIG. 2 is a flowchart of a sequential program in the control unit of FIG. 1B.

Whereas the steps S20 to S23 and S34 of a flowchart in FIG. 4 each correspond to the steps S0 to S3 and S11 of the program sequence according to FIG. 2, the voltage Vext is varied incrementally in steps S24 to S33, and the commutator 1 is placed in both settings for each value of Vext. In the program sequence illustrated in FIG. 4 it is also possible to adopt the alternative procedure, in the same way as has been described above for the program sequence illustrated in FIG. 2, that Vext is predefined as the maximum expected value of the internal reference voltage Vint, and is then incrementally reduced by DV.

It is to be noted that, instead of one comparator 2, as is contained in the exemplary embodiments illustrated in FIGS. 1A and 3A, two comparators can also be easily used to increase the common mode range.

The invention described above enables the self-alignment method for adjusting the correct reference voltage of a semiconductor chip to be carried out easily independently of the offset voltage of an operational amplifier used as a comparator, so that the requirements of the operational amplifier with respect to the offset voltage can be reduced.

The voltage value determined by the measuring method according to the invention described above can then be used to set the correct voltage value to operate the semiconductor chip by, for example, the method described in the above-mentioned German Patent DE 199 60 244.1 by firing or burning in fuses selected by an address generator.

We claim:

1. A method for measuring and setting of a voltage of an adjustable internal reference voltage source of an integrated semiconductor circuit, the method which comprises:
   a. providing a reference voltage from the internal reference voltage source and an external comparison voltage to a respective one of two voltage inputs of a commutator having two voltage outputs and being alternatively switchable to a first and a second commutating state via one of a clock signal and a switching signal from a control unit, both signals being applied to a clock input of the commutator;
   b. switching the commutator to the first commutating state;
   c. applying, in the first commutating state, at the same time, via the voltage outputs of the commutator, the reference voltage and the external comparison voltage, respectively to a first and second input of a comparator having an output;
   d. comparing the reference voltage and the external comparison voltage via the comparator in first commutating state;
   e. varying, via the control unit, one of the reference voltage and the external comparison voltage in a direction of a setpoint voltage value of one of the reference voltage and the external comparison voltage until the control unit detects a changing logic value of the comparator output;
   f. buffering, via the control unit, the voltage value varied in the preceding varying step and present for the current commutation state of the commutator upon the control unit detecting the changing logic value of the comparator output;
   g. switching the commutator to the second commutating state;
   h. applying, in the second commutating state, at the same time the reference voltage and the external comparison voltage via the voltage outputs of the commutator, respectively to the first and the second input of the comparator;
   i. comparing, in the second commutating state, the reference voltage and the external comparison voltage via the comparator;
   j. repeating steps e and f;
   k. forming, via the control unit, an average value for the reference voltage from the buffered voltage values; and
   l. setting the reference voltage as a function of the average value formed in the preceding step.

2. The method according to claim 1, wherein the control unit performs the varying step by maintaining the internal reference voltage constant while varying the external comparison voltage.

3. The method according to claim 2, wherein the control unit incrementally varies the external comparison voltage and clocks or switches the commutator to assume the two commutating states of the commutator for each voltage value of the external comparison voltage.

4. The method according to claim 1, wherein the control unit performs the step of switching the commutating state and varying step by:
   in the first commutating state of the commutator, firstly varying the external comparison voltage in a voltage range around the setpoint voltage value with the reference voltage kept constant, and performing the buffering step by buffering that voltage value of the external comparison voltage at which the comparator output changes its logic state; and
   in the second commutating state of the commutator in which the reference voltage and the external comparison voltage are interchanged between the two comparator inputs in comparison with the first commutating state of the commutator, varying the external comparison voltage in a voltage range around the setpoint voltage value with the reference voltage kept constant, and performing the buffering step by storing that voltage value of the external comparison voltage at which the comparator output changes its logic state.

5. The method according to claim 4, which-comprises incrementally varying the external comparison voltage with the control unit.

6. The method according to claim 1, wherein the control unit incrementally varies the external comparison voltage and assumes the two commutating states of the commutator for each voltage value of the external comparison voltage.

7. The method according to claim 1, which further comprises maintaining the external comparison voltage constant at a setpoint value for the internal reference value while varying the internal reference voltage.

8. The method according to claim 7, which further comprises performing the switching and varying steps by:
- in a first switched state of the commutator, varying the reference voltage in a voltage range around the voltage value of the external comparison voltage that is kept constant with the external comparison voltage kept constant, and performing the buffering step by storing that voltage value of the reference voltage at which the comparator output changes its logic state; and
- in the second switched state of the commutator, varying the reference voltage in a voltage range around the voltage value of the external reference voltage that is kept constant with the external comparison voltage kept constant, and performing the buffering step by storing that voltage value of the internal reference voltage at which the comparator output changes its logic state.

9. The method according to claim 8, which further comprises incrementally varying the internal reference voltage.

10. A device for carrying out the method according to claim 1, comprising:
- an internal reference voltage source providing an internal reference voltage;
- an external comparison voltage source providing an external comparison voltage;
- a comparator having two comparator inputs;
- a commutator having two commutator inputs and two commutator outputs;
- each of said two commutator inputs connected to a respective one of said internal reference voltage source and said external comparison voltage source; and
- each of said two commutator outputs directly connected to said two comparator inputs, said commutator alternately switching said two comparator inputs between said internal reference voltage and said external comparison voltage.

11. The device according to claim 10, including a control unit connected to said commutator for switching said commutator.

12. The device according to claim 10, wherein:
- the integrated semiconductor circuit is part of a chip; and
- at least said commutator and said comparator are provided on the chip.

13. The device according to claim 11, wherein said control unit is a program-controlled processor unit programmed:
- to store the voltage values present for each switched state of the commutator; and
- to form an average value for the reference voltage from the stored voltage values.

14. The device according to claim 13, wherein said processor unit has a means for storing the voltage values.

15. The device according to claim 13, wherein said processor unit has a means for forming an average value for the reference voltage from the stored voltage values.

16. The device according to claim 13, wherein said processor unit has a storage device for storing the voltage values.

17. The device according to claim 13, wherein said processor unit has an average value forming device for forming an average value for the reference voltage from the stored voltage values.

18. The device according to claim 14 wherein:
- an external testing device tests the integrated semiconductor circuit; and
- said control unit is part of the external testing device.

19. A device for measuring and setting of a voltage of an adjustable internal reference voltage source of an integrated semiconductor circuit, comprising:
- an internal reference voltage source providing an internal reference voltage;
- an external comparison voltage source providing an external comparison voltage;
- a comparator having two comparator inputs and a comparator output for outputting a logic value;
- a commutator having switched stages, a switch input, two commutator inputs, and two commutator outputs;
- each of said two commutator inputs connected to a respective one of said internal reference voltage source and said external comparison voltage source;
- each of said two commutator outputs directly connected to a respective one of said two comparator inputs;
- said commutator alternately switching said two comparator inputs between said internal reference voltage and said external comparison voltage;
- said comparator comparing said internal reference voltage to said external comparison voltage;
- a switch control having a switch output connected to said switch input of said commutator for alternatively applying said internal reference voltage and said external comparison voltage to said two comparator inputs at the same time; and
- one of said internal reference voltage and said external comparison voltage are varied in a direction of a setpoint voltage value until said comparator output changes said logic value at each switched stage of said commutator.

20. A method for measuring and setting of a voltage of an adjustable internal reference voltage source of a dynamic semiconductor memory, which method comprises:
- comparing a reference voltage to an external comparison voltage with a comparator having two inputs;
- switching a commutator by one of a clock signal and a switching signal applied from a control unit to a clock input terminal of the commutator to alternatively switch the commutator between a first and a second commutating state to alternatively apply the reference voltage supplied from the dynamic semiconductor memory and the external comparison voltage supplied from the control unit to the two inputs of the comparator at the same time, the commutator having two voltage input terminals for respectively receiving the reference voltage and the external comparison voltage and two voltage output terminals for supplying the alternately two switched input voltages;
- varying with the control unit one of the reference voltage and the external comparison voltage in a direction of a setpoint voltage value of one of the reference voltage and the external comparison voltage until the comparator output changes its logic value at each switched stage of the commutator;
- buffering with the control unit the voltage values respectively varied in the preceding varying step and present for each commutating state of the commutator when the logic value of the comparator output changes;
- forming with the control unit an average value for the reference voltage from the stored voltage values; and setting the reference voltage in the dynamic semiconductor circuit as a function of the average value formed in the preceding forming step.

21. The device according to claim 19, including a control unit configured to:
   to form a measured value for said internal reference voltage that is to be set in accordance with a result of a comparison of said comparator;
   to buffer voltage values present for each of said switched states of said commutator when said logic value changes and said one of said internal reference voltage and said external comparison voltage is varied;
   to form an average value for said internal reference voltage from stored voltage values; and
   to set said internal reference voltage as a function of said average value formed.

22. The device according to claim 19, wherein said switch control is a clock-control.

23. The device according to claim 19, wherein said switch control is a software-control.

24. A device for measuring and setting of a voltage of an adjustable internal reference voltage source of a dynamic semiconductor memory, comprising:
   an internal reference voltage source providing an internal reference voltage;
   an external comparison voltage source providing an external comparison voltage;
   a comparator having two comparator inputs and a comparator output for outputting a logic value;
   a commutator having switched stages, a switch input, two commutator inputs, and two commutator outputs;
   each of said two commutator inputs connected to a respective one of said internal reference voltage source and said external comparison voltage source;
   each of said two commutator outputs directly connected to a respective one of said two comparator inputs;
   said commutator alternately switching said two comparator inputs between said internal reference voltage and said external comparison voltage;
   said comparator comparing said internal reference voltage to said external comparison voltage;
   a switch control having a switch output connected to said switch input of said commutator for alternatively applying said internal reference voltage and said external comparison voltage to said two comparator inputs at the same time; and
   one of said internal reference voltage and said external comparison voltage are varied in a direction of a setpoint voltage value until said comparator output changes said logic value at each switched stage of said commutator.

* * * * *